United States Patent [19]
Roohparvar et al.

[11] Patent Number: 6,141,247
[45] Date of Patent: *Oct. 31, 2000

[54] NON-VOLATILE DATA STORAGE UNIT AND METHOD OF CONTROLLING SAME

[75] Inventors: Frankie F. Roohparvar, Cupertino; Michael S. Briner, San Jose, both of Calif.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 09/217,874

[22] Filed: Dec. 21, 1998

Related U.S. Application Data

[63] Continuation-in-part of application No. 08/958,487, Oct. 24, 1997, Pat. No. 5,864,499.

[51] Int. Cl.[7] .................................................... G11C 14/00
[52] U.S. Cl. ................................ 365/185.08; 365/185.33
[58] Field of Search ........................ 365/185.08, 185.04, 365/185.29, 185.33, 218

[56] References Cited

U.S. PATENT DOCUMENTS

| | | | |
|---|---|---|---|
| 4,308,627 | 1/1982 | Tabata | 307/632 |
| 4,460,982 | 7/1984 | Gee et al. | 365/189 |
| 4,571,704 | 2/1986 | Bohac, Jr. | 365/156 |
| 4,858,185 | 8/1989 | Kowshik et al. | 365/181 |
| 5,031,142 | 7/1991 | Castro | 365/49 |
| 5,047,664 | 9/1991 | Moyal | 307/303 |
| 5,097,449 | 3/1992 | Cuevas | 365/185.08 |
| 5,144,159 | 9/1992 | Frisch et al. | 307/272.3 |
| 5,214,316 | 5/1993 | Nagai | 307/272.3 |
| 5,249,158 | 9/1993 | Kynett et al. | 365/230.03 |
| 5,280,447 | 1/1994 | Hazen et al. | 365/185 |
| 5,282,990 | 2/1994 | Yoneto et al. | 252/51.5 R |
| 5,311,470 | 5/1994 | Atsumi et al. | 365/189.05 |
| 5,369,754 | 11/1994 | Fandrich et al. | 395/425 |
| 5,377,199 | 12/1994 | Fandrich | 371/22.3 |
| 5,378,936 | 1/1995 | Kokubo et al. | 327/77 |
| 5,402,370 | 3/1995 | Fazio et al. | 365/185 |
| 5,463,757 | 10/1995 | Fandrich et al. | 395/430 |
| 5,509,134 | 4/1996 | Fandrich et al. | 395/430 |
| 5,526,364 | 6/1996 | Roohparvar | 371/22.1 |
| 5,546,561 | 8/1996 | Kynett et al. | 395/490 |
| 5,615,159 | 3/1997 | Roohparvar | 365/201 |
| 5,619,453 | 4/1997 | Roohparvar et al. | 365/185.33 |
| 5,627,784 | 5/1997 | Roohparvar | 365/189.01 |
| 5,661,690 | 8/1997 | Roohparvar | 365/201 |
| 5,675,540 | 10/1997 | Roohparvar | 365/185.22 |
| 5,677,885 | 10/1997 | Roohparvar | 365/201 |

FOREIGN PATENT DOCUMENTS

| 3-206709 | 9/1991 | Japan | H03K 17/22 |
|---|---|---|---|

*Primary Examiner*—Trong Phan
*Attorney, Agent, or Firm*—Schwegmen, Lundberg, Woessner & Kluth, P.A.

[57] ABSTRACT

A non-volatile data storage unit having a data input and a volatile memory device for storing data. The volatile memory device is preferably a latch circuit made up of a pair of cross-coupled inverter circuits which store the data in complementary form. A non-volatile memory device, such as a pair of flash memory cells, is included which also store data in complementary form. Control circuitry is provided for controlling the operation of the data storage unit, including circuitry for transferring data from the data input to the volatile memory device and circuitry for programming the non-volatile memory device with data from the volatile memory device. The storage unit also preferably includes circuitry for transferring data stored in the non-volatile memory device to the volatile memory device, with such transfer typically taking place after an interruption of power to the storage unit.

17 Claims, 2 Drawing Sheets

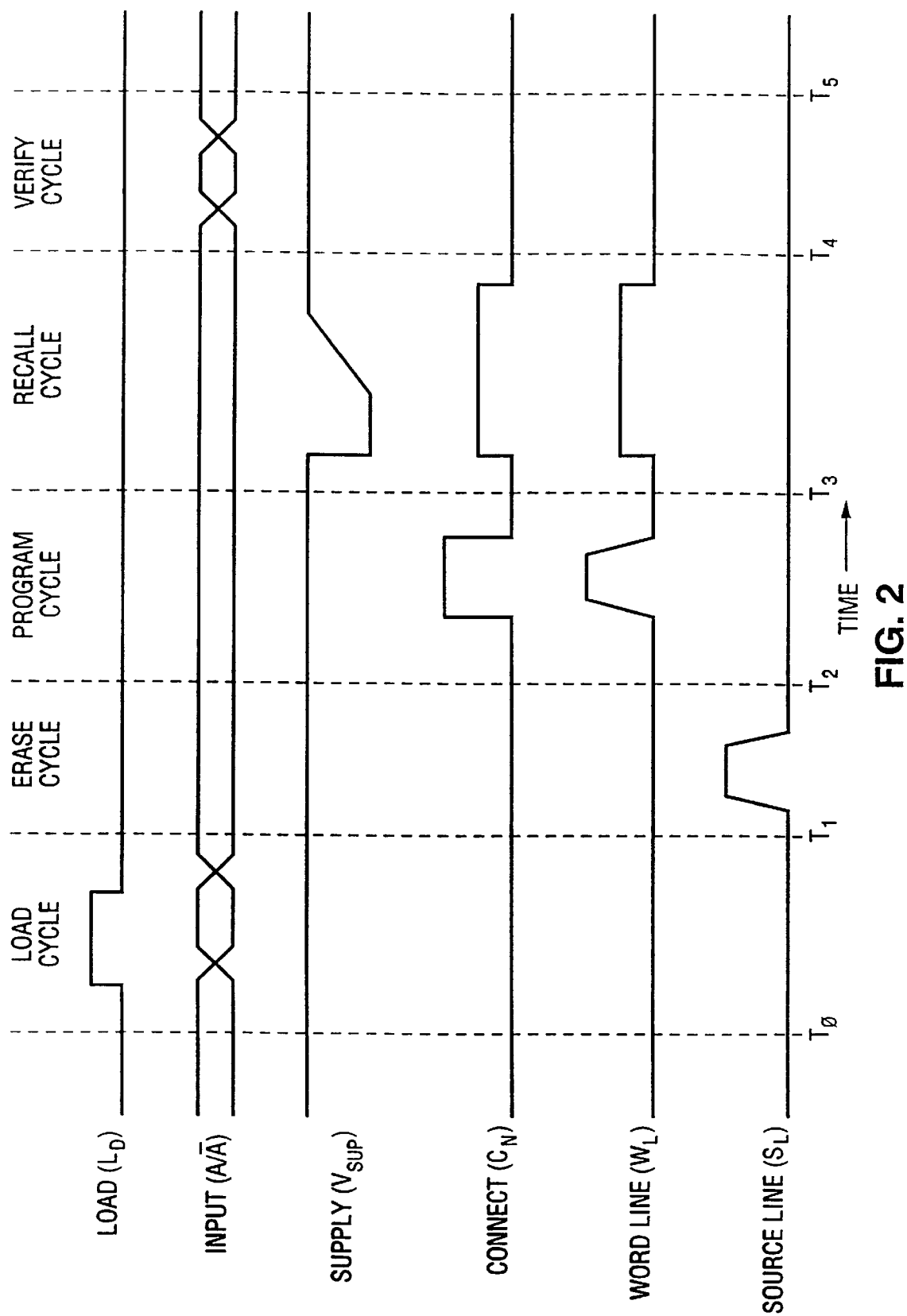

NON-VOLATILE DATA STORAGE UNIT AND METHOD OF CONTROLLING SAME

This application is a continuation of U.S. Ser. No. 08/958,487 filed Oct. 27, 1998, U.S. Pat. No. 5,864,499, issued Jan. 26, 1999.

BACKGROUND OF THE INVENTION

1. Field of the Invention

The present invention relates generally to data storage and in particular to a non-volatile data storage unit which may be programmed to a predetermined value, erased and read and a method of controlling the data storage unit.

2. Background Art

In many integrated circuit devices, it is desirable to have the capability of storing certain parameters relating to the operation of the integrated circuit. By way of example, sometimes an integrated circuit is implemented so that it can be used in different operating modes. The circuit can be configured at a fabrication facility to permanently operate in only one mode, depending upon the requirements of a particular user. This can be achieved by modifying the metallization layer of the integrated circuit so that the desired operating mode is achieved.

This approach has one advantage in that the change in metallization is permanent and will not be affected by loss of operating power. However, this advantage is offset by many disadvantages. A major disadvantage is that further changes in the stored operating parameters cannot be made once the metallization has been completed. This is particularly disadvantageous where the value of the stored parameters is dependent upon the characteristics of the integrated circuit which frequently cannot be ascertained until the metallization has been completed. In addition, once the integrated circuit has been packaged, it is frequently impossible to ascertain the value of the stored parameter.

The present invention provides the capability of storing operating parameters in an integrated circuit which can be altered at any time after the fabrication process. Once a parameter has been stored, the parameter is retained even in the event of a loss of power. In addition, the stored parameter can be examined to determine the state of the parameter. These and other advantages of the present invention will be obvious to those skilled in the art upon a reading of the following Detailed Description of the Invention together with the drawings.

SUMMARY OF THE INVENTION

A non-volatile data storage unit is disclosed having a data input and a volatile memory device for storing data. Typically, the volatile memory device is a latch circuit comprising a pair of cross-coupled inverter circuits which store the data in complementary form. The data storage unit further includes a non-volatile memory device such as a pair of flash memory cells which also store data in complementary form.

Control means is provided for controlling the operation of the data storage unit. The control means includes load means for transferring data from the data input to the volatile memory device. Typically, the load means includes a pair of transistors coupled between the data inputs and the latch circuit which force the latch circuit to a state determined by the input data.

The control means further includes program means for programming the non-volatile memory device with the data stored in the volatile memory device. In the event the non-volatile memory device is implemented by a pair of flash memory cells, the current for programming the cells is preferably provided by output transistors of the volatile memory device.

BRIEF DESCRIPTION OF THE DRAWINGS

FIG. 2 is a timing diagram illustrating the various operating modes of the subject data storage unit, including the Load Cycle, the Erase Cycle, the Program Cycle, the Recall Cycle and the Verify Cycle.

DETAILED DESCRIPTION OF THE INVENTION

Figure 1:
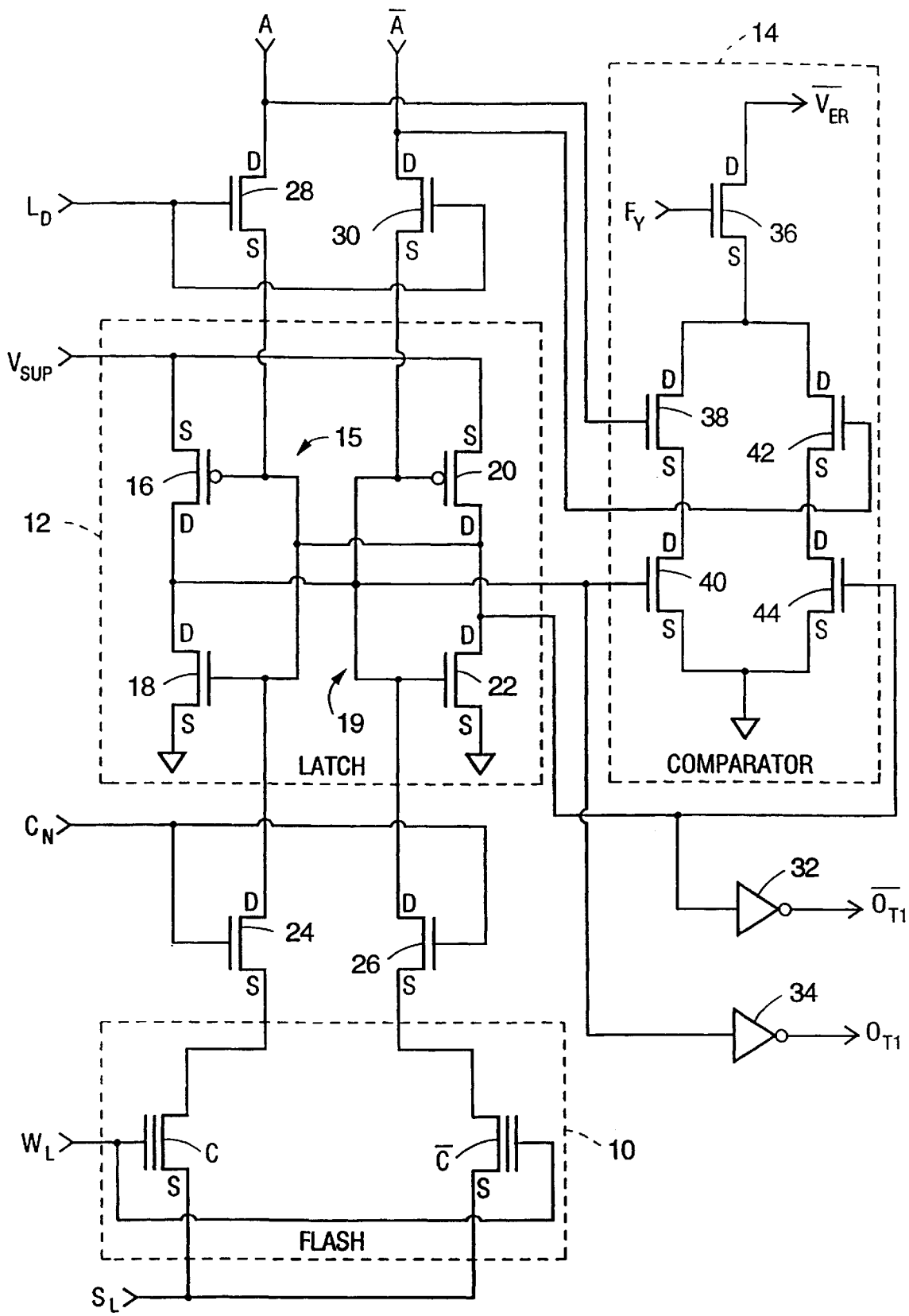
FIG. 1 is a detailed schematic diagram of the subject non-volatile data storage unit.

Referring to the drawings, FIG. 1 is a detailed schematic diagram of one embodiment of the present invention. The subject data storage unit is capable of storing a single bit of parameter data. Multiple bits can be stored by simply providing a separate storage unit for each bit. The storage unit includes a non-volatile memory or Flash section 10, a volatile Latch section 12 and a Comparator section 14. The flash section includes a pair of flash memory cells C and $\overline{C}$ for storing one bit of parameter data in complementary form. As is well known, a flash cell utilizes a floating gate transistor having a drain, source, floating gate and control gate. Data is stored in the cell by adding or removing charge from the floating gate. Erasure is accomplished by removing charge by way of Fowler-Nordheim tunneling from the floating gate through a thin gate oxide disposed intermediate the floating gate and the cell channel. The flash cells have their common source regions connected to a common source line which receives signal $S_L$ and their control gates connected to a common word line which receives signal $W_L$.

The Latch section 12 includes a pair of cross-coupled inverters which form a latch circuit. A first inverter 15 includes a P channel transistor 16 connected in series with an N channel transistor 18. The common drain connections of transistors 16 and 18 form the output of the inverter and the common gate connection form the input. The second inverter 19 includes a P channel transistor 20 connected in series with an N channel transistor 22. The common drain connection of transistors 20 and 22 form the output of the second inverter 19 and the common gate connection forms the input.

As previously noted, the two inverters of the Latch section 12 are connected to form a latch circuit. In particular, the output of the first inverter 15, the common drain connection of transistors 16 and 18, is connected to the input of the second inverter 19, the common gate connection of transistors 20 and 22. The output of the second inverter 19, the common drain connection of transistors 20 and 22, is connected back to the input of the first inverter 15, the gates of transistors 16 and 18.

The output of the first inverter 15 of the Latch section 12 is connected to the drain of flash cell $\overline{C}$ by way of a N channel transistor 26 and the output of the second inverter 19 is connected to the drain of flash cell C by way of N channel transistor 24. The gates of the two connect transistors 24 and 26 are connected to a common control line which carries signal $C_N$.

The Latch section 12 is powered by applying a voltage $F_{SUP}$ to the sources of transistors 16 and 20. As will be explained, the magnitude of the voltage $F_{SUP}$ can be controlled by conventional circuitry, the details of which are not described since they are conventional and form no part of the present invention.

Data to be loaded into the Latch section 12 is provided in complementary form A and $\overline{A}$ by way of N channel transistors 28 and 30. The common gates of the transistors 28 and 30 are connected to a line which receives a load signal $L_D$. Transistor 28 functions to couple data input A to the input of the first inverter 15 of Latch section 12 and transistor 30 functions to couple data input $\overline{A}$ to the input of the second inverter 19.

The two complementary outputs of the Latch section 12 are coupled to respective inverters 32 and 34. The outputs of inverters 32 and 34 form the complementary outputs $\overline{O}_{T1}$ and $O_{T1}$ of the subject data storage unit. The outputs of the Latch section 12 are also coupled to respective inputs of a comparator circuit 14. The data inputs A and $\overline{A}$ are also coupled to respective inputs of the comparator circuit 14. As will be explained, the comparator circuit 14 functions to compare the data stored in the Latch section 12 with the data inputs A and $\overline{A}$ so that the state of the latch circuit can be verified. Typically, the output of the Comparator section 14, signal $\overline{V}_{ER}$ is wire ORed to other Comparator sections 14 associated with other data storage units so that a single verification signal $\overline{V}_{ER}$ can be used to indicate whether there is a match between the contents of the Latch section 12 and the associated data inputs A and $\overline{A}$ among several of the subject storage units.

Comparator section 14 includes five N channel transistors 36, 38, 40, 42 and 44. Transistor 36 is coupled between the comparator output $\overline{V}_{ER}$ and the common drain connection of transistors 38 and 42. In addition, the gate of transistor 36 is connected to receive signal $F_V$ which is active when the state of the Comparator section 14 is to be sampled. Transistors 38 and 40 are connected in series, with the gate of transistor 38 connected to receive data input A and the gate of transistor 40 connected to receive the output of the first inverter 15 of Latch section 12. Similarly, transistors 42 and 44 are connected in series, with the gate of transistor 42 connected to receive data input $\overline{A}$ and the gate of transistor 44 connected to receive the output of the second inverter 19 of Latch section 12. As will be explained, when the complementary data inputs A and $\overline{A}$ match the complementary outputs of the two Latch section inverters, the output of the comparator circuit 14, $\overline{V}_{ER}$ will be high, otherwise the output will be low.

The present invention provides a high degree of flexibility. There are a total of five operations which the subject storage unit can perform, including Load, Erase, Program, Recall and Verify. These operations will each be described in connection with the timing diagram of FIG. 2 together with the schematic diagram of FIG. 1. As will be explained in greater detail, the flash cell C and $\overline{C}$ are programmed by first loading the programming data into the Latch section 12. In addition, the flash cells C and $\overline{C}$ are read by transferring the contents of the flash cells to the Latch section 12.

Load The function of the Load cycle is to set the Latch section 12 to a known state based upon the complementary input data A and $\overline{A}$. The Load operation is required prior to the Program operation to ensure that the Latch circuit 12 is at the desired state.

The beginning of the Load cycle is indicated by time $T_0$. Following time $T_0$, the input data A and $\overline{A}$ is applied to the drains of transistors 28 and 30. Once the input data are stabilized, the load signal $L_D$ is made active thereby turning on transistors 28 and 30. In addition, the Latch section 12 supply voltage $F_{SUP}$ is maintained at its nominal primary supply voltage $V_{CC}$ level of +5 volts. Assuming, for example, that A is a high level, the input of the first inverter 15, the common gates of transistors 16 and 18 will be pulled up to a high level. At the same time, complementary signal $\overline{A}$ will be at a low level and will tend to pull the input of the second inverter 19, the gates of transistors 20 and 22, down to a low level by way of load transistor 30.

This combined opposing action on the inputs of the two inverters will force the output of the first inverter 15 to a low state and the output of the second inverter 19 to a high state. The Latch section 12 will hold or store this data until it is altered by a subsequent Load operation, until it is changed by a Recall operation (as will be explained) or until the power is removed from the system. Load transistors must be of sufficient size so as to be capable of forcing the Latch section 12 transistors to the desired state.

Erase The operation for erasing the flash cells C and $\overline{C}$ commences at time $T_1$. This cycle is performed directly on the cells rather than by way of the Latch section 12. The connect signal $C_N$ is inactive in this operation so that both connect transistors 24 and 26 will be non-conductive. Thus, the drains of cells C and $\overline{C}$ will be left floating. In addition, signal $W_L$ connected to the word line of the two cells is grounded and the signal $S_L$ connected to the sources of the two cells is raised to a large positive voltage such as +12 volts. As is well known, under these conditions, the cells C and $\overline{C}$ will both be erased by way of Fowler-Nordheim tunneling. The Flash section 10 must then be appropriately programmed so that the cells C and $\overline{C}$ will store complementary data.

Program The Programming cycle commences at time $T_2$. As previously noted, the Latch circuit 12 must have been previously set to the desired programmed state of the Flash section 10. Load signal $L_D$ is inactive so that transistors 28 and 30 are off. The supply voltage $F_{SUP}$ is at a nominal value of +6 volts. Assume, for example, that the Latch section 12 had previously been set such that the output of inverter 15 is at a low level and the output of inverter 19 is at a high level. In that event, the drain of transistor 24 will be close to the supply voltage $F_{SUP}$ and the drain of transistor 26 will be close the circuit common.

The connect signal $C_N$ is made active (high) shortly after time $T_2$, thereby turning on transistors 24 and 26 and effectively connecting the supply voltage $V_{SUP}$ and circuit common to the drain of cells C and $\overline{C}$, respectively. The connect signal $C_N$ switches to a high level of +12 volts in the Programming cycle so that transistors 24 and 26 have a sufficient gate-source voltage to connect the supply voltage $F_{SUP}$ of +6 volts to either one of the drains of cells C and $\overline{C}$ depending upon the data stored in the latch. In this case, cell C will get the $F_{SUP}$ on its drain. At the same time, the control gates of the cells C and $\overline{C}$ are connected to word line signal $W_L$ having a magnitude equal to +12 volts. In fact, in many cases $C_N$ and $W_L$ can be the same signal. The source line signal $S_L$ is at circuit common and is connected to the common sources of cells C and $\overline{C}$. This combination of voltages applied to cell C will cause the cell to be programmed whereas those applied to cell $\overline{C}$ will not result in programming of the cell. In order to enable the cells C and $\overline{C}$ to be programmed to opposite states, it is necessary to first erase both cells in an Erase cycle prior to performing the Programming cycle. As previously noted, the Latch circuit 12 must have also been previously set in order to carry out a Programming cycle.

Transistor 20 of inverter circuit 19 will provide the programming current, which is typically 500 microamperes, to cell C. If cell $\overline{C}$ is being programmed, the programming current is provided by transistor 16 of inverter circuit 15. Thus, transistors 16 and 20 of the Latch circuit 12 must be of sufficient size to be able to conduct these programming currents. As previously noted, transistors 28 and 30 must also be sized so that they have sufficient strength to force transistors 16 and 20 to a desired state during the Load cycle. Typically, the programming voltages will be applied for a relatively long duration ranging from a few hundred microseconds to a millisecond. Since the data is stored in cells C and $\overline{C}$ in complementary form and since, as will be explained, the cells will be read in a differential manner, there is a large error tolerance margin. Accordingly, it is not necessary to perform any type of program verification as is frequently done in flash memory systems to confirm that the data has been properly programmed.

Recall The Recall cycle is illustrated in the FIG. 2 diagram beginning at time $T_3$. In this operation, the complementary states of cells C and $\overline{C}$ are transferred to the Latch section 12. When power is removed from the data storage unit, the data is not retained in volatile Latch section 12. Accordingly, when power is reapplied, initialization circuitry is used to cause the transfer of the data stored in the non-volatile cells C and $\overline{C}$ to the Latch section 12.

Since the flash cells C and $\overline{C}$ have a limited drive capability and would not normally have sufficient strength to force the transistors of the Latch section 12 to a desired state, the supply voltage $V_{SUP}$ is momentarily dropped to a low level approaching ground potential in the initial stage of the Recall operation. In addition, the connect signal $C_N$ is made active thereby connecting the Flash section 10 to the Latch section 12 by way of transistors 24 and 26. The word line of cells C and $\overline{C}$ is connected to a signal $W_L$ having a magnitude equal to the primary supply voltage $V_{CC}$ of typically +5 volts. Again, signals $W_L$ and $C_N$ can be the same signal for this operation.

The Recall cycle is preferably initiated by some form of power-on-reset circuit which will cause the Recall cycle to be performed at power on and when the primary supply voltage $V_{CC}$ drops to some predetermined level which would possibly affect the state of the Latch circuit 12. The Recall cycle is initiated by the power-on-reset circuit when the circuit has detected that the primary supply voltage $V_{CC}$ has ramped up to about +3 volts after initial power on or has ramped up to about +3 volts after a drop in voltage $V_{CC}$ below that level.

During the Recall cycle, the common source line signal $S_L$ is also set to ground potential. Assuming that cell C has been programmed and cell $\overline{C}$ is in an erased state, cell C will be non-conductive so that the input of inverter 15 of the Latch section 12 will not be affected. Cell $\overline{C}$ will be conductive and tend to pull the input of inverter 19 of the Latch section 12 down to ground potential.

Since the Latch section 12 is not powered at this point, cell $\overline{C}$ is capable of pulling the input of inverter 19 down to a low level despite the limited drive capability of the cells. As can be seen from the FIG. 2 timing diagram, voltage $V_{SUP}$ is held to a low value momentarily and then is increased to the normal operating level. Preferably, the voltage is increased at a slow rate.

As the supply voltage $V_{SUP}$ increases, the cell $\overline{C}$ will continue to hold the input of inverter 19 at a low level so that P channel transistor 20 will proceed to turn on. This will cause the output of inverter 19 to be high which will, in turn, cause the input of inverter 15 to also be high. Thus, transistor 18 of inverter 15 will also begin to turn on thereby causing the output of inverter 15 to go low thereby reinforcing cell $\overline{C}$ in pulling down the input of inverter 19. Eventually, the supply voltage $V_{SUP}$ will be at the normal high voltage of $V_{CC}$ or typically +5 volts and the Latch circuit 12 will be in the desired state of indicating the state of the Flash section 10.

Even though cell $\overline{C}$ has a very small drive capability, by controlling the supply voltage $V_{SUP}$ as described, the cell is capable of forcing the Latch section 12 to the desired state. Programmed cell C will not have much, if any, tendency to pull the input of inverter 15 down and thus will not oppose the action of cell $\overline{C}$. However, even if the programmed threshold voltage of cell C approached the erased threshold voltage of cell $\overline{C}$, it can be seen that the cell with the largest cell current will still be able to control the state of the Latch circuit 12. This differential action enhances the reliability of the operation of the subject data storage unit. Note also that the outputs of inverters 15 and 19 are coupled to respective inverters 32 and 34 so that loading on the Latch section outputs will be equal. The Latch section will thus remain capacitively balanced so as to enhance the ability of the flash cells C and $\overline{C}$ to force the Latch section to any desired state.

Verify As previously explained, the Verify cycle is used to determine the state of the Latch section 12. This operation can be used to determine the state of the Flash section 10 if it preceded by a Recall cycle. The Verify cycle utilizes the complementary data inputs A and $\overline{A}$ and compares them with the state of the Latch section 12. Comparator section 14 functions essentially as an exclusive NOR circuit and provides a logic low output $\overline{V}_{ER}$ in the event there is a match between the Latch section 12 and the data input A and $\overline{A}$.

By way of example, assume that a Verify cycle is to take place so that the verify signal $F_V$ is made active. This will cause transistor 36 of the Comparator section 14 to be conductive. Further assume that data input A is a logic "1" (high) so that $\overline{A}$ is a logic "0" (low). Still further assume that inverter 15 output of the Latch section 12 is a logic "0" so that the inverter 19 output will be a logic "1". Since input A is high and since the output of inverter 15 is low, transistor 38 of the Comparator 14 section will be conductive and transistor 40 will be off. Similarly, since input $\overline{A}$ is low and the output of inverter 19 is high, transistor 42 will be off and transistor 44 will be on. There is a pull-up device (not depicted) connected between the output of the Comparator section 14 and voltage $V_{CC}$. As a result of transistors 40 and 42 being off, there will be no conductive path between the source of transistor 36 and the circuit common. Accordingly, the output $\overline{V}_{ER}$ will remain in a high state ("1") indicating a valid compare.

If the outputs of inverters 15 and 19 were logic "1" and "0", respectively, and the data inputs A and $\overline{A}$ remain the same, transistors 38 and 40 will both be conductive. Thus, when transistor 36 is turned on by signal $F_V$, the output $V_{ER}$ will be pulled down to a logic "0" indicating a no compare condition.

In the event the data inputs A and $\overline{A}$ are a logic "0" and "1" respectively, and the outputs of inverters 15 and 19 are a logic "1" and "0", respectively, transistors 38 and 44 will be off. Thus, signal $V_{ER}$ will be a logic "1" thereby indicating a valid compare. Continuing, if inputs A and $\overline{A}$ were a logic "0" and "1", respectively and inverters 15 and 19 were a logic "0" and "1", respectively, transistors 42 and 44 will be conductive so that signal $\overline{V}_{ER}$ will be at a logic "0", thereby indicating a no compare.

Thus, a novel data storage unit has been disclosed.

Although one embodiment has been described in some detail, it is to be understood that certain changes can be made by those skilled in the art without departing from the spirit and scope of the invention as defined by the appended claims.

We claim:

1. An integrated circuit, operable in one of a plurality of operating modes, comprising:
   an input connection for receiving an input signal, the input signal is used to select the one of the plurality of operating modes;
   a first latch circuit coupled to the input connection to volatilely store the input signal;
   a second latch coupled to input connection and the first latch for non-volatilely storing the input signal; and
   a comparator to compare the input signal on the input connection with data stored in either the first or second latch.

2. The integrated circuit of claim 1 wherein the first latch circuit is an inverter logic circuit.

3. The integrated circuit of claim 1 wherein the second latch circuit is a floating gate memory cell.

4. An integrated circuit, operable in one of a plurality of operating modes, comprising:
   first and second input connections for receiving an complementary input signals, the input signals are used to select the one of the plurality of operating modes;
   a first latch circuit coupled to the input connections to volatilely store the input signals;
   a second latch coupled to input connections and the first latch for non-volatilely storing the input signals; and
   a comparator to compare the input signal on the input connection with data stored in either the first or second latch.

5. The integrated circuit of claim 4 wherein the first latch circuit comprises:
   a first inverter logic circuit coupled to the first input connection; and
   a second inverter logic circuit coupled to the second input connection.

6. The integrated circuit of claim 5 wherein the second latch circuit comprises:
   a first floating gate memory cell coupled to the first inverter logic circuit; and
   a second floating gate memory cell coupled to the second inverter logic circuit.

7. The integrated circuit of claim 4 wherein the second latch circuit comprises a pair of floating gate memory cells coupled to receive the complementary input signals.

8. An integrated circuit, operable in one of a plurality of operating modes, comprising:
   an input connection for receiving an input signal, the input signal is used to select the one of the plurality of operating modes;
   a first isolation circuit coupled to the input connection;
   a first latch circuit coupled to the first isolation circuit to volatilely store the input signal;
   a second isolation circuit coupled to the first latch circuit; and
   a second latch coupled to second isolation circuit to non-volatilely store the input signal.

9. The integrated circuit of claim 8 wherein the first latch circuit comprises a pair of cross coupled inverter circuits.

10. The integrated circuit of claim 8 wherein the second latch comprises at least one floating gate transistor.

11. The integrated circuit of claim 8 wherein first and second isolation circuits comprise a field effect transistor.

12. An integrated circuit, operable in one of a plurality of operating modes, comprising:
   first and second input connections for receiving an complementary input signals, the input signals are used to select the one of the plurality of operating modes
   a first isolation circuit coupled to the input connections to selectively isolate the first and second input connections from a first latch circuit to volatilely store the input signals; and
   a second isolation circuit coupled to the first latch circuit to selectively isolate the first latch circuit from a second latch circuit to non-volatilely store the input signals.

13. The integrated circuit of claim 12 wherein the first latch circuit comprises a pair of cross coupled inverter circuits.

14. The integrated circuit of claim 12 wherein the second latch comprises two floating gate transistors.

15. The integrated circuit of claim 12 wherein first and second isolation circuits comprise a field effect transistors.

16. An integrated circuit, operable in one of a plurality of operating modes, comprising:
   a first input connection coupled to receive a first input signal;
   a second input connection coupled to receive a second input signal, the second input signal is a complement of the first input signal;
   a first latch circuit to volatilely store the first and second input signals, the first latch circuit comprises a pair of cross coupled logic circuits and first and second inputs;
   a first isolation transistor coupled between the first input connection and the first input of the first latch circuit;
   a second isolation transistor coupled between the second input connection and the second input of the second latch circuit;
   a second latch circuit to non-volatilely store the first and second input signals, the second latch circuit comprising first and second floating gate transistors;
   a third isolation transistor coupled between the first input connection and the first floating gate transistor of the second latch circuit; and
   a fourth isolation transistor coupled between the second input connection and the second floating gate transistor of the second latch circuit.

17. The integrated circuit of claim 16 further comprising a comparator circuit, coupled to the first and second inputs and the first latch circuit, to compare the first and second input signals with data stored in either the first or second latch circuits.

* * * * *

UNITED STATES PATENT AND TRADEMARK OFFICE
CERTIFICATE OF CORRECTION

PATENT NO.: 6,141,247
DATED: Oct. 31, 2000
INVENTOR(S): Roohparvar et al.

It is certified that error appears in the above-identified patent and that said Letters Patent is hereby corrected as shown below:

On the face page, section [63], delete "Continuation-in-part" and insert --Continuation--, therefor.
In column 1, line 5, delete "Oct. 27, 1998" and insert --Oct. 24, 1997--, therefor.
In column 4, line 42, delete "close the circuit" and insert --close to the circuit--, therefor.
In column 6, line 25, delete "it preceded" and --it is preceded--, therefor.
In column 6, line 66, delete the paragraph break before "Although".
In column 7, claim 4, line 24, delete "an".
In column 8, claim 12, line 11, delete "an".
In column 8, claim 15, line 28, delete "transistors" and insert --transistor--, therefor.

Signed and Sealed this

Twenty-ninth Day of May, 2001

*Attest:*

NICHOLAS P. GODICI

*Attesting Officer*  *Acting Director of the United States Patent and Trademark Office*